United States Patent
Tung

(10) Patent No.: US 9,330,968 B1
(45) Date of Patent: May 3, 2016

(54) METHOD OF FABRICATING INTEGRATED CIRCUIT

(71) Applicant: UNITED MICROELECTRONICS CORP., Hsin-Chu (TW)

(72) Inventor: Yu-Cheng Tung, Kaohsiung (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 23 days.

(21) Appl. No.: 14/534,180

(22) Filed: Nov. 6, 2014

(51) Int. Cl.
*H01L 21/768* (2006.01)

(52) U.S. Cl.
CPC .................................. *H01L 21/76816* (2013.01)

(58) Field of Classification Search
None
See application file for complete search history.

(56) References Cited

U.S. PATENT DOCUMENTS

| | | | | |
|---|---|---|---|---|
| 6,128,070 A * | 10/2000 | Peng | .................... | G03F 7/70633 355/53 |
| 7,440,105 B2 * | 10/2008 | Adel | ...................... | B82Y 10/00 257/797 |
| 7,474,401 B2 * | 1/2009 | Ausschnitt | .......... | G03F 7/70633 356/401 |
| 9,064,741 B1 * | 6/2015 | Wu | .......................... | H01L 22/12 |
| 2006/0007431 A1 * | 1/2006 | Smith | .................... | B82Y 10/00 356/150 |
| 2011/0155904 A1 | 6/2011 | Hotta | | |
| 2013/0295698 A1 * | 11/2013 | Pforr | ........................ | G03F 1/38 438/14 |
| 2014/0356982 A1 * | 12/2014 | Barash | .................... | H01L 22/12 438/5 |

* cited by examiner

*Primary Examiner* — Charles Garber
*Assistant Examiner* — Steven Christopher
(74) *Attorney, Agent, or Firm* — Winston Hsu; Scott Margo

(57) ABSTRACT

A method of fabricating an integrated circuit includes the following steps. A first reticle is used to form a first pattern and a first alignment mark and a second reticle is used to form a second pattern and a second alignment mark in a same layer. A third reticle is aligned to the first alignment mark and the second alignment mark, to obtain an overlay correction value; additionally, a third reticle is aligned to the first alignment mark to obtain a first overlay correction value, a third reticle is aligned to the second alignment mark to obtain a second overlay correction value, and a total overlay correction value is obtained by trading off the first overlay correction value and the second overlay correction value. The third reticle is used to form a third pattern by aligning the third reticle with the total overlay correction value.

20 Claims, 4 Drawing Sheets

METHOD OF FABRICATING INTEGRATED CIRCUIT

BACKGROUND OF THE INVENTION

1. Field of the Invention

The present invention relates generally to a method of fabricating an integrated circuit, and more specifically to a method of fabricating an integrated circuit relating to the alignment of photoresist patterns.

2. Description of the Prior Art

In the fabrication of semiconductor integrated circuits (ICs), semiconductor devices are connected by several metallic interconnecting layers commonly referred to as multi-level interconnects. A damascene process is a convenient and predominant method for forming the multi-level interconnects. The damascene process includes etching a dielectric material layer to form trench and/or via patterns, filling the patterns with conductive materials such as copper, and performing a planarization process. Thus a metal interconnect is obtained.

Photolithography is an essential process in the fabrication of semiconductor ICs. Principally, photolithography forms designed patterns such as implantation patterns or layout patterns on at least a reticle, and then precisely transfers such pattern to a photoresist layer by exposure and development steps. Subsequently, by performing semiconductor processes such as ion implantation, etching processes, or deposition, the complicated and sophisticated IC structure is obtained.

With the miniaturization of semiconductor devices and corresponding progress in fabrication methods, conventional lithography processes have met a bottleneck due to printability and manufacturability. To meet the requirements of device design rules which continue to push the resolution limits of existing processes and tooling, a double patterning technique (DPT) has been developed. This is one of the most promising lithography technologies for 32 nanometer (nm) node and 22 nm node patterning since it can increase the half-pitch resolution by up to 200% using current infrastructures.

SUMMARY OF THE INVENTION

The present invention provides a method of fabricating an integrated circuit, which forms two patterns by a double patterning process and then forms a pattern overlapping the two patterns by aligning a reticle exposing the pattern to both the two patterns, in order to get a compromising correction value.

The present invention provides a method of fabricating an integrated circuit including the following steps. A first reticle is used to form a first pattern and a first alignment mark and a second reticle is used to form a second pattern and a second alignment mark in a same layer. A third reticle is aligned to the first alignment mark and the second alignment mark, to obtain an overlay correction value. The third reticle is used to form a third pattern by aligning the third reticle with the overlay correction value.

The present invention provides a method of fabricating an integrated circuit including the following steps. A first reticle is used to form a first pattern and a first alignment mark and a second reticle is used to form a second pattern and a second alignment mark in a same layer. A third reticle is aligned to the first alignment mark to obtain a first overlay correction value. A third reticle is aligned to the second alignment mark to obtain a second overlay correction value. A total overlay correction value is obtained by trading off the first overlay correction value and the second overlay correction value. The third reticle is used to form a third pattern by aligning the third reticle with the total overlay correction value.

According to the above, the present invention provides a method of fabricating an integrated circuit, which forms a first pattern and a second by double patterning processes, and then aligns a third reticle to a first alignment mark and a second alignment mark for forming a third pattern overlapping both the first pattern and the second pattern, to obtain an overlay correction value. Therefore, the third pattern can be formed by aligning the third reticle with the overlay correction value.

Additionally, a third reticle may be individually aligned to the first alignment mark and the second alignment mark; a first overlay correction value can thereby be obtained by only aligning the third reticle to the first alignment mark and a second overlay correction value can be obtained by only aligning the third reticle to the second overlay correction value. A total overlay correction value can be obtained by trading off the first overlay correction value and the second overlay correction value. The third pattern can be formed by aligning the third reticle with the total overlay correction value.

To sum up, the third pattern can be formed by aligning the third reticle to both the first and the second patterns to get a compromising correction value.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
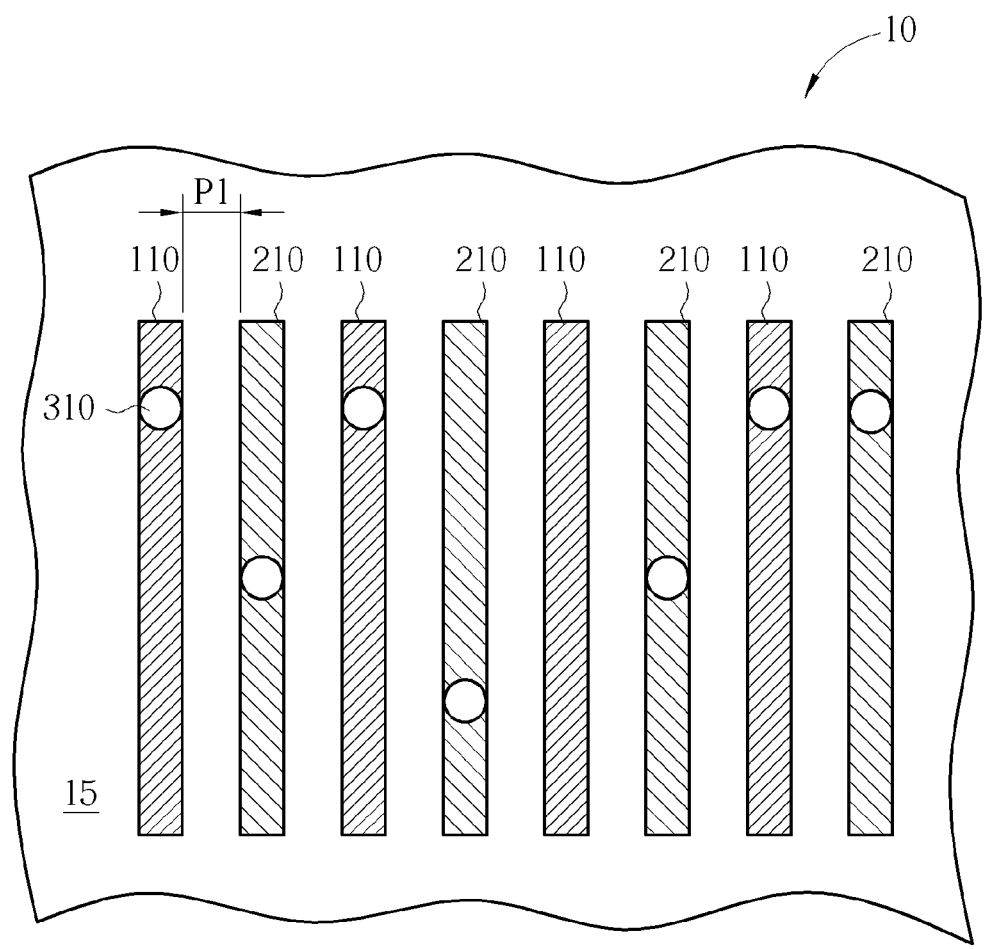
FIG. 1 schematically depicts a top view of an ideal pattern formed on an integrated circuit according to an embodiment of the present invention.

FIG. 1 schematically depicts a top view of an ideal pattern formed on an integrated circuit according to an embodiment of the present invention. As shown in FIG. 1, a first pattern 110 and a second pattern 210 are formed on a substrate 10. In this embodiment, the substrate 10 is a wafer having multilayers formed thereon and the first pattern 110 and the second pattern 210 are formed in a same layer 15 on the substrate 10. However, in another embodiment, the first pattern 110 and the second pattern 210 may be formed indifferent layers. More precisely, the first pattern 110 and the second pattern 210 are interconnect patterns, such that the layer 15 may be an inter-metal dielectric (IMD) while the first pattern 110 and the second pattern 210 are interconnect patterns formed therein. In another embodiment, the first pattern 110 and the second pattern 210 may be polysilicon gate patterns or contact patterns, and the layer 15 is an inter-layer dielectric (ILD), depending upon practical requirements. A third pattern 310 is formed to overlap the first pattern 110 as well as the second pattern 210. In this embodiment, the third pattern 310 is a via pattern formed in different layers from the first pattern 110 and the second pattern 210 serving as the interconnect patterns, but it is not limited thereto. The first pattern 110 is parallel to the second pattern 210. The first pattern 110 and the second pattern 210 are arranged alternately, and a pitch P1 between each line of the first pattern 110 and the second pattern 210 is the same.

FIG. 1 shows an ideal pattern to be formed on an integrated circuit. As the scale of manufacturing processes of the integrated circuit becomes smaller and the wavelength of current exposure machines is limited, patterns such as interconnect patterns on the reticle are too close to each other. This leads to incorrect patterns developed on the wafer due to light interference, such that the integrated circuit fails. In order to solve the problem of incorrectly developed patterns on the wafer due to insufficient gaps between interconnect patterns and via patterns, a double patterning technique is utilized as follows.

Figure 2:
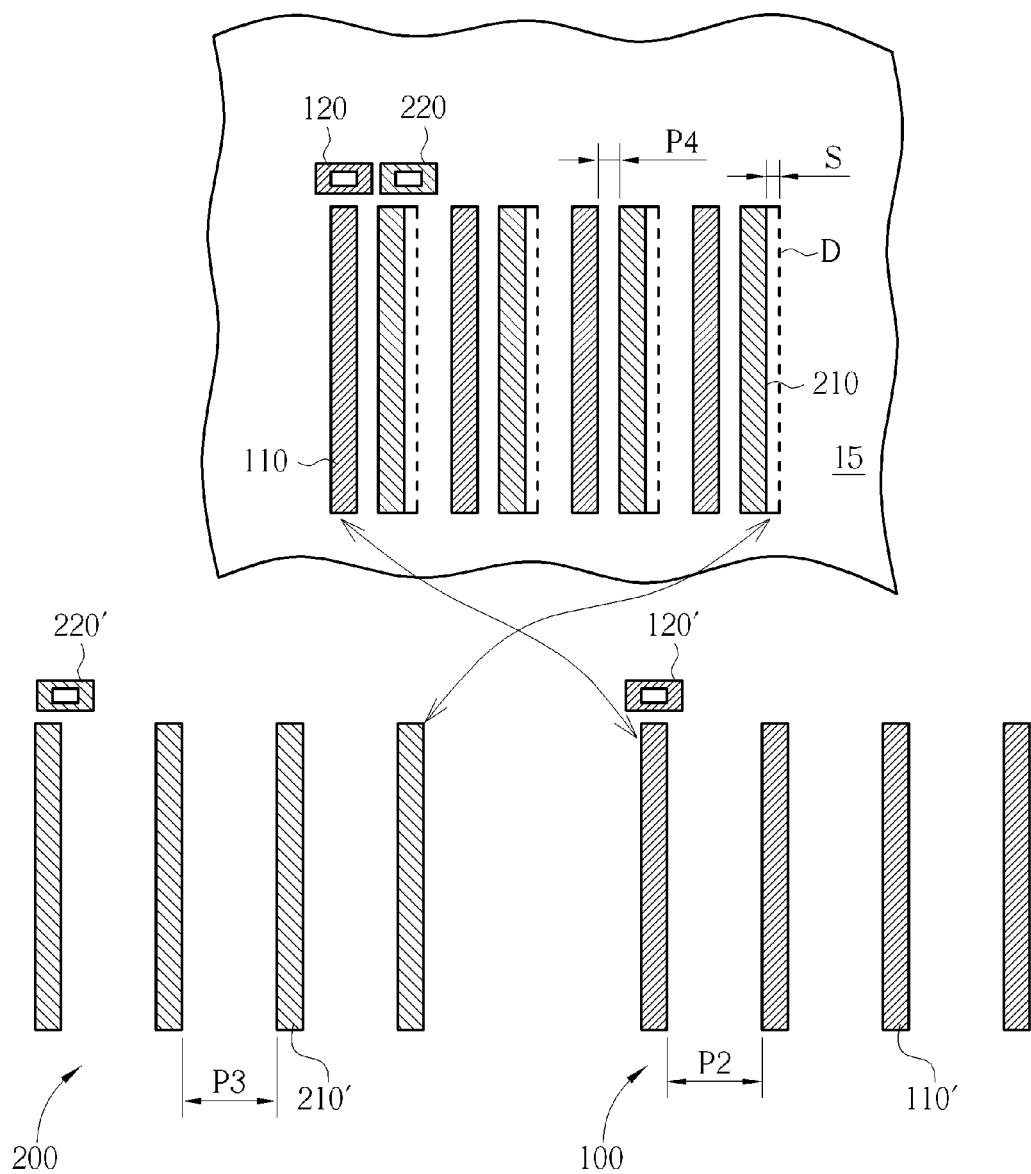
FIG. 2 schematically depicts top views of a part of a real pattern shown in FIG. 1 formed on an integrated circuit and two corresponding reticles according to an embodiment of the present invention.

A double patterning technique is used, for example, one interconnect pattern having a pitch of about 100 nm is split into two patterns both having a pitch of about 200 nm. The interconnect pattern with a 100 nm pitch can then be formed on an integrated circuit wafer by printing both patterns with the looser pitch into the same layer of photoresist. As shown in FIG. 2, a first feature 110' corresponding to the first pattern 110 and a second feature 210' corresponding to the first pattern 210 are respectively formed onto a first reticle 110 and a second reticle 200, so that the first reticle 110 includes the first feature 110' and a first alignment mark 120' while the second reticle 200 includes the second feature 210' and a second alignment mark 220'.

The first reticle 100 is used to form the first pattern 110 and a first alignment mark 120 in the layer 15 on the substrate 10. This means the first pattern 110 is transferred from the first feature 110' and the first alignment mark 120 is transferred from the first alignment mark 120'. Then, the second reticle 200 is used to form the second pattern 210 and a second alignment mark 220 in the layer on the substrate 10. This means the second pattern 210 is transferred from the second feature 210' and the second alignment mark 220 is transferred from the second alignment mark 220'. The order of exposing the first reticle 100 and the second reticle 200 to the layer 15 may be reversed.

In this embodiment, the first pattern 110 is a first interconnect pattern and the second pattern 210 is a second interconnect pattern, so that positions of interconnects in one single layer 15 can be defined by the first pattern 110 and the second pattern 210. The methods of forming these interconnects are well known in the art, and are not described herein. In this case, the first pattern 110 is parallel to the second pattern 210. Preferably, the first pattern 110 and the second pattern 210 divided by one single pattern in the same layer 15 are arranged alternately, so that a pitch P2 between each line of the first feature 110' or a pitch P3 between each line of the second feature 210' can be the same, and also be larger than a minimum pitch between lines of the first feature 110' or lines of the second feature 210', which are not arranged alternately. This means the first feature 110' and the second feature 210' can have looser pitches, but is not limited thereto.

It is emphasized that, as one single pattern is divided into the two patterns of the first pattern 110 and the second pattern 210 formed by respectively using the first reticle 100 and the second reticle 200, a shifting S must occur between the first pattern 110 and the second pattern 210. Dashed lines D represent the ideal position of the second pattern 210. A pitch P4 in a real case of FIG. 2 is different from the pitch P1 in the ideal case of FIG. 1.

Figure 3:
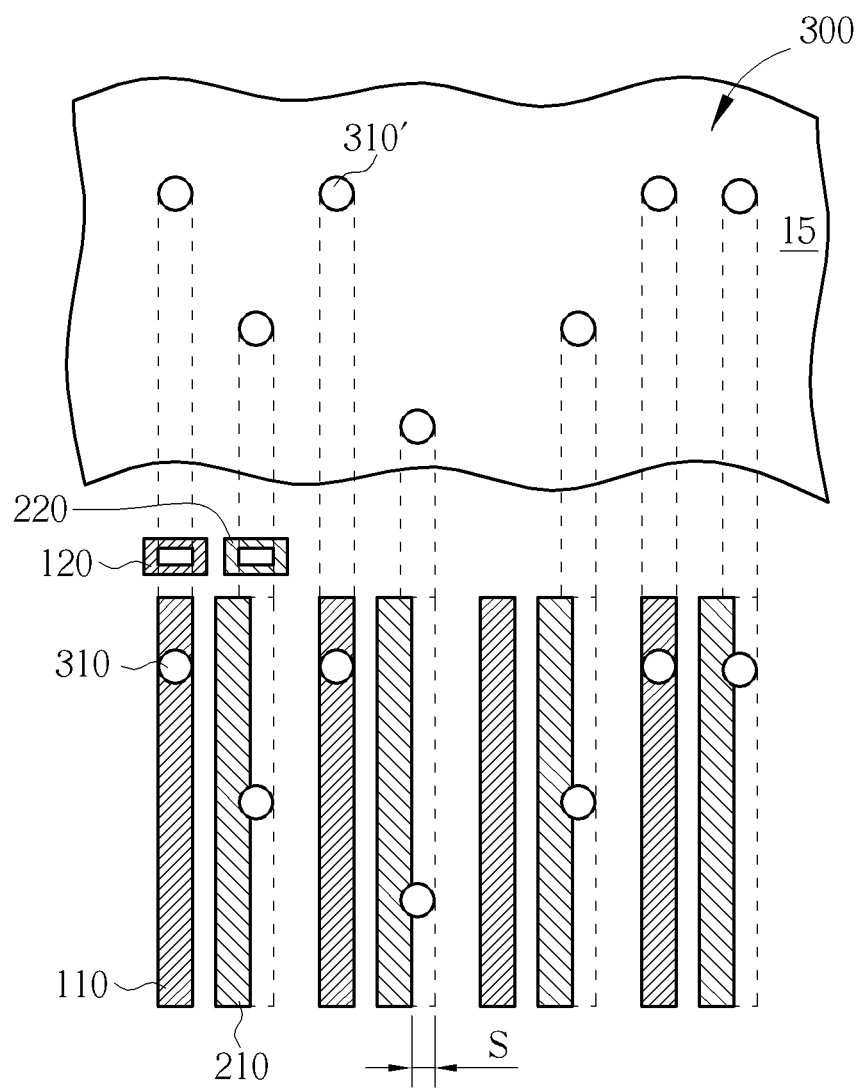
FIG. 3 schematically depicts top views of a real pattern shown in FIG. 1 formed on an integrated circuit and one corresponding reticle according to an embodiment of the present invention.

A double patterning process is used to enhance feature density by using multiple lithographic processes to form a single layer. Thus, spacing between pattern features in the device can effectively be reduced even though the reticles used in the pattern transfer process may have comparatively larger feature spacing. When dealing with reduced pattern spacing, however, even slight errors in alignment between the pattern steps can affect the arrangement of the first and second patterns with respect to each other. Thus, conventional optical overlay targets and their attending measurement techniques may be insufficient to provide the necessary tolerances for double-patterning processes. As shown in FIG. 3, a third reticle 300 is used to form a third pattern 310 overlapping both the first pattern 110 and the second pattern 210 by aligning the third reticle 300 to the first alignment mark 120. In this embodiment, the third pattern 310 is a via pattern while the first pattern 110 and the second pattern 210 are both interconnect patterns, and the third pattern may be formed in different layers from the first pattern 110 and the second pattern 210.

The third pattern 310 corresponding to the first pattern 110 can overlap the first pattern 110 accurately due to aligning the third reticle 300 to the first alignment mark 120, but the third pattern 310 corresponding to the second pattern 210 cannot overlap the second pattern 210 accurately because of the shifting S between the first pattern 110 and the second pattern 210. Likewise, if the third pattern 310 is formed by aligning the third reticle 300 to the second alignment mark 220 instead, the third pattern 310 corresponding to the second pattern 210 can overlap the second pattern 210 accurately due to aligning the third reticle 300 to the second alignment mark 220, but the third pattern 310 corresponding to the first pattern 110 cannot overlap the first pattern 110 accurately because of the shifting S between the first pattern 110 and the second pattern 210. The shifting S of the third pattern 310 overlapping the second pattern 210 (or the first pattern 110) may not be tolerant and achieve processing requirements.

Figure 4:
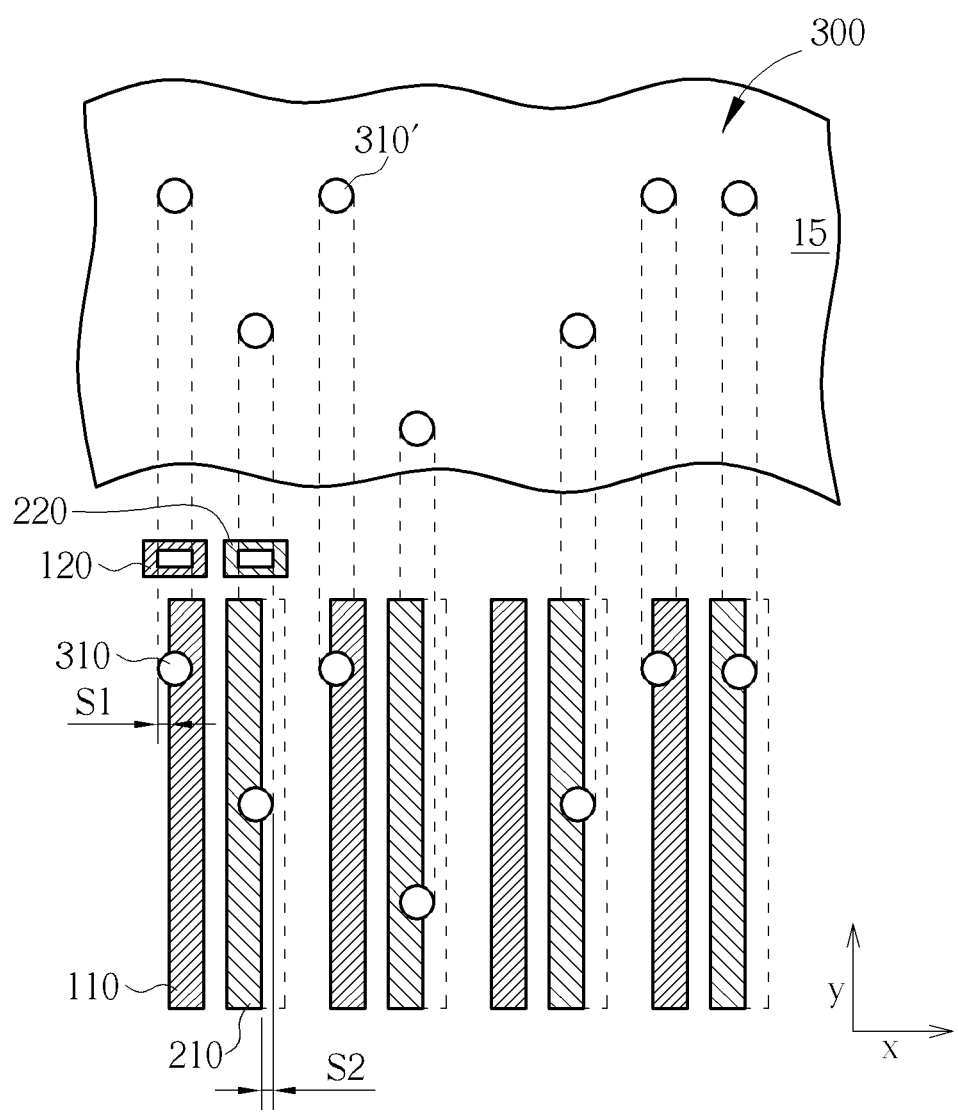
FIG. 4 schematically depicts top views of a real pattern shown in FIG. 1 formed on an integrated circuit and one corresponding reticle according to an embodiment of the present invention.

A first preferred method of the present invention is presented as follows. As shown in FIG. 4, a third reticle 300 is aligned to both the first alignment mark 120 and the second alignment mark 220 instead, to obtain an overlay correction value for exposure. In other word, the overlay correction value is obtained by alignment, and for exposure later. The overlay correction value is obtained by treating the first pattern 110 and the second pattern 210 as one single pattern. Then, the third reticle 300 is used to form a third pattern 310 by a lithography apparatus through aligning the third reticle 300 with the overlay correction value. Since the overlay correction value is obtained by aligning the third reticle 300 to both the first alignment mark and the second alignment mark, the third pattern 310 can overlap both the first pattern 110 and the second pattern 210 in a compromising way. The shifting S of the third pattern 310 overlapping the second pattern 210 shown in FIG. 3 can be shared by the shifting S1 of the third pattern 310 overlapping the first pattern 110 and the shifting S2 of the third pattern 310 overlapping the second pattern 210 shown in FIG. 4. In one case, the shifting S equals the sum of the shifting S1 and the shifting S2, so that the shifting S1 and the shifting S2 can respectively fall into the tolerance and achieve processing requirements. The method of the present invention is not an in-line inspection, but an alignment method for exposure. After the exposure, an inspection is operated to verify the accuracy, thus the value may being corrected and then feed backed to the system.

A second preferred method of the present invention is also presented. In this embodiment, the third reticle 300 is aligned to the first alignment mark 120 and the second alignment mark 220 individually to obtain overlay correction values, respectively, instead of being aligned to both the first alignment mark 120 and the second alignment mark 220 by treating the first pattern 110 and the second pattern as one single pattern in order to obtain only one overlay correction value. In other words, the third reticle 300 is aligned to the first alignment mark 120 to obtain a first overlay correction value; and the third reticle 300 is aligned to the second alignment mark 220 to obtain a second overlay correction value. The first pattern 110 and the second pattern 210 are treated as different patterns to get their overlay correction values individually. In this case, the method of the present invention is not an in-line inspection, but an alignment method for exposure. After the exposure, an inspection is operated to verify the accuracy, thus the value may being corrected and then feed backed to the system.

A total overlay correction value is obtained by trading off the first overlay correction value and the second overlay correction value, wherein the total overlay correction value may be obtained via a computer system calculation. More precisely, the total overlay correction value may be an average value of the first overlay correction value and the second overlay correction value, or may be a weighting average value of the first overlay correction value and the second overlay correction value, but is not limited thereto. When the total overlay correction value is a weighting average value of the first overlay correction value and the second overlay correction value, the weighting in the x direction and y direction may be different. As shown in FIG. 4, the weighting in the x direction should be larger than the weighting in the y direction since the tolerance in the x direction is less than the tolerance in the y direction. In one case, the first overlay correction value and the second overlay correction value may be correction values of the first pattern 110 and the second pattern 210 in a same direction. In this case, the first overlay correction value and the second overlay correction value may be correction values of the first pattern 110 and the second pattern 210 only in the x direction since the tolerance in the y direction is much larger than the tolerance in the x direction; thus, the tolerance in the y direction can be omitted for simplifying processes by only focusing on the tolerance in the x direction.

In another case, the weighting of the first overlay correction value (or the second overlay correction value) is at least over 50% in the x direction and y direction due to the tolerance in the first overlay correction value (or the second overlay correction value) being larger than the tolerance in the second overlay correction value (or the first overlay correction value). In an extreme case, the total overlay correction value may be obtained by excluding one of the first overlay correction value and the second overlay correction value.

To summarize, the present invention provides a method of fabricating an integrated circuit, which forms a first pattern and a second pattern by double patterning processes, thus causing shifting between the first pattern and the second pattern, and then aligns a third reticle to a first alignment mark and a second alignment mark for forming a third pattern which overlaps both the first pattern and the second pattern, to thereby obtain an overlay correction value. The third pattern can be formed by aligning the third reticle with the overlay correction value.

Additionally, a third reticle may be aligned to the first alignment mark and the second alignment mark individually, thereby a first overlay correction value can be obtained by only aligning the third reticle to the first alignment mark and a second overlay correction value can be obtained by only aligning the third reticle to the second overlay correction value. A total overlay correction value can be obtained by trading off the first overlay correction value and the second overlay correction value. The third pattern can be formed by aligning the third reticle with the total overlay correction value. The total overlay correction value may be an average value of the first overlay correction value and the second overlay correction value; and the total overlay correction value may be a weighting average value of the first overlay correction value and the second overlay correction value, but is not limited thereto.

The third pattern can be formed by aligning the third reticle to both the first and the second patterns in many different ways to get a compromising correction value. The third reticle may be aligned to the first and the second patterns by treating the first and the second pattern as one single pattern, or the third reticle may be aligned to the first and the second patterns by treating the first and the second pattern as different patterns.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating an integrated circuit, comprising:
   using a first reticle to form a first pattern and a first alignment mark and using a second reticle to form a second pattern and a second alignment mark;
   aligning a third reticle to the first alignment mark and the second alignment mark, to obtain an overlay correction value; and
   using the third reticle to form a third pattern through a lithography apparatus by aligning the third reticle with the overlay correction value.

2. The method of fabricating an integrated circuit according to claim 1, wherein the first pattern and the second pattern are formed in a same layer.

3. The method of fabricating an integrated circuit according to claim 1, wherein the first pattern and the second pattern are arranged alternately.

4. The method of fabricating an integrated circuit according to claim 1, wherein the third pattern is formed in different layers from the first pattern and the second pattern.

5. The method of fabricating an integrated circuit according to claim 1, wherein the third pattern is a via pattern while the first pattern is a first interconnect pattern and the second pattern is a second interconnect pattern.

6. The method of fabricating an integrated circuit according to claim 1, wherein the third pattern overlaps the first pattern and the second pattern.

7. The method of fabricating an integrated circuit according to claim 1, wherein the overlay correction value is obtained by treating the first pattern and the second pattern as a single pattern.

8. A method of fabricating an integrated circuit, comprising:
   using a first reticle to form a first pattern and a first alignment mark and using a second reticle to form a second pattern and a second alignment mark;
   aligning a third reticle to the first alignment mark to obtain a first overlay correction value;
   aligning a third reticle to the second alignment mark to obtain a second overlay correction value;

obtaining a total overlay correction value by trading off the first overlay correction value and the second overlay correction value; and using the third reticle to form a third pattern through a lithography apparatus by aligning the third reticle with the total overlay correction value.

9. The method of fabricating an integrated circuit according to claim 8, wherein the first pattern is parallel to the second pattern.

10. The method of fabricating an integrated circuit according to claim 8, wherein the first pattern and the second pattern are arranged alternately.

11. The method of fabricating an integrated circuit according to claim 8, wherein the third pattern is formed in different layers from the first pattern and the second pattern.

12. The method of fabricating an integrated circuit according to claim 8, wherein the third pattern is a via pattern while the first pattern is a first interconnect pattern and the second pattern is a second interconnect pattern.

13. The method of fabricating an integrated circuit according to claim 8, wherein the third pattern overlaps the first pattern and the second pattern.

14. The method of fabricating an integrated circuit according to claim 8, wherein the total overlay correction value is an average value of the first overlay correction value and the second overlay correction value.

15. The method of fabricating an integrated circuit according to claim 8, wherein the total overlay correction value is a weighting average value of the first overlay correction value and the second overlay correction value.

16. The method of fabricating an integrated circuit according to claim 15, wherein the weighing in the x direction and y direction are different.

17. The method of fabricating an integrated circuit according to claim 15, wherein the weighting of the first overlay correction value is at least over 50% in the x direction or y direction.

18. The method of fabricating an integrated circuit according to claim 8, wherein the total overlay correction value is obtained by excluding one of the first overlay correction value and the second overlay correction value.

19. The method of fabricating an integrated circuit according to claim 8, wherein the first overlay correction value and the second overlay correction value are correction values of the first pattern and the second pattern in a same direction.

20. The method of fabricating an integrated circuit according to claim 8, wherein the first pattern and the second pattern are formed in a same layer.

* * * * *